United States Patent
Kim et al.

(10) Patent No.: US 7,856,043 B2
(45) Date of Patent: Dec. 21, 2010

(54) VERTICAL EXTERNAL CAVITY SURFACE EMITTING LASER WITH PUMP BEAM REFLECTOR

(75) Inventors: Ki-sung Kim, Hwaseongi-si (KR); Taek Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 381 days.

(21) Appl. No.: 11/448,774

(22) Filed: Jun. 8, 2006

(65) Prior Publication Data
US 2007/0104241 A1    May 10, 2007

(30) Foreign Application Priority Data
Nov. 9, 2005    (KR)    ........... 10-2005-0107031

(51) Int. Cl.
*H01S 5/00*    (2006.01)
(52) U.S. Cl. ............. 372/50.124; 372/22; 372/36; 372/50.11
(58) Field of Classification Search ............. 372/22, 372/50.124
See application file for complete search history.

(56) References Cited

U.S. PATENT DOCUMENTS

| | | | |
|---|---|---|---|
| 5,237,584 A * | 8/1993 | Shannon et al. | 372/93 |
| 5,461,637 A * | 10/1995 | Mooradian et al. | 372/92 |
| 5,513,202 A * | 4/1996 | Kobayashi et al. | 372/96 |
| 5,513,204 A * | 4/1996 | Jayaraman | 372/96 |
| 6,097,742 A * | 8/2000 | Caprara et al. | 372/22 |
| 6,301,281 B1 * | 10/2001 | Deng et al. | 372/50.11 |
| 6,611,546 B1 * | 8/2003 | Garnache et al. | 372/92 |
| 2001/0043636 A1 * | 11/2001 | Bewley et al. | 372/70 |
| 2002/0080836 A1 * | 6/2002 | Hwang | 372/45 |

* cited by examiner

*Primary Examiner*—Minsun Harvey
*Assistant Examiner*—Xnning Niu
(74) *Attorney, Agent, or Firm*—Cantor Colburn LLP (57) ABSTRACT

A vertical external cavity surface emitting laser (VECSEL) using end pumping in which a pumping beam is recycled using a pumping beam reflection layer to increase pumping beam absorption is provided. The VECSEL includes: an active layer for generating and emitting signal light; an external mirror that is separated from and faces a top surface of the active layer and transmits a first portion of the signal light and reflects a second portion of the signal light to the active layer; a first reflection layer contacting a lower surface of the active layer and reflecting the signal light to the external mirror; a pump laser for emitting the pumping beam toward the lower surface of the active layer to excite the active layer; and a second reflection layer contacting the top surface of the active layer and reflecting a portion of the pumping beam back to the active layer.

21 Claims, 7 Drawing Sheets

VERTICAL EXTERNAL CAVITY SURFACE EMITTING LASER WITH PUMP BEAM REFLECTOR

CROSS-REFERENCE TO RELATED PATENT APPLICATION

This application claims the benefit of Korean Patent Application No. 10-2005-0107031, filed on Nov. 9, 2005 in the Korean Intellectual Property Office, the disclosure of which is incorporated herein in its entirety by reference.

BACKGROUND OF THE DISCLOSURE

1. Field of the Disclosure

The present disclosure relates to an external cavity surface emitting laser, and more particularly, to an end pumping external cavity surface emitting laser in which pumping beam is recycled using a pumping beam reflection layer to increase absorption of the pumping beam by an active layer.

2. Description of the Related Art

A vertical cavity surface emitting laser (VCSEL) oscillates in a single longitudinal mode of a very narrow spectrum and emits a beam having a small radiation angle. VCSELs can be integrated easily with other devices, but the output of the VCSELs is low.

A vertical external cavity surface emitting laser (VECSEL) is a high output laser with the above-described advantages of the VCSEL. The VECSEL has an external mirror instead of an upper mirror, resulting in an increased gain region, and can thus output several to dozens of watts of light.

Figure 1:
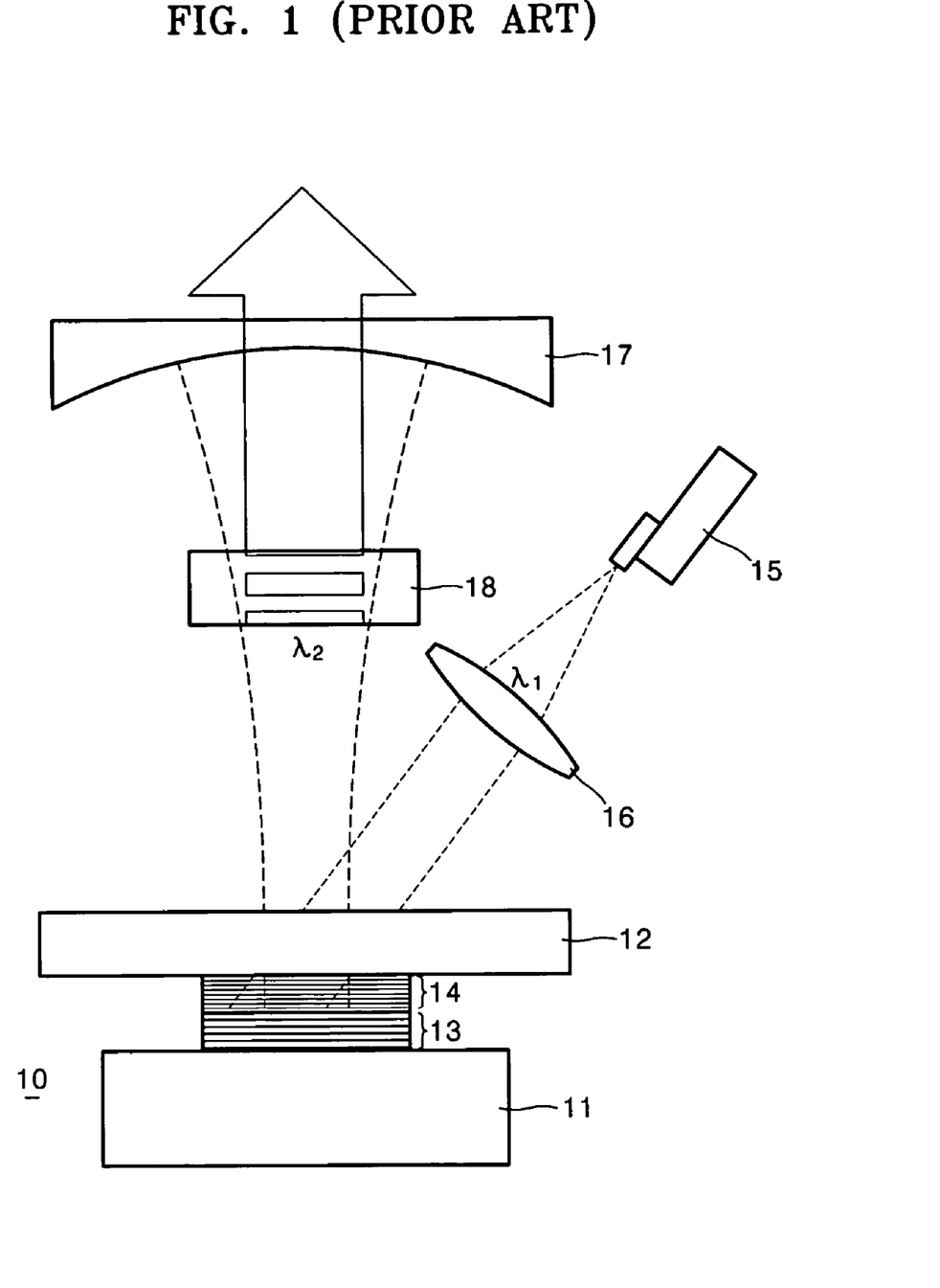
FIG. 1 is a schematic view of a conventional vertical external cavity surface emitting laser (VECSEL) using front pumping.

FIG. 1 is a schematic view of a VECSEL 10. The VECSEL 10 is a front pumping laser in which light is pumped by a pump laser 15 which is disposed obliquely in the front of the VECSEL 10. As illustrated in FIG. 1, the VECSEL 10 includes a heat sink 11, a Distributed Bragg Reflector (DBR) layer 13 and an active layer 14 sequentially stacked on the heat sink 11, an external mirror 17 that faces the active layer 14 and is separated a predetermined distance from the active layer 14, and a pump laser 15 disposed obliquely toward the top surface of the active layer 14. A heat spreader 12 may be further formed on the top surface of the active layer 14 to spread the heat generated by the active layer 14, and a second harmonic generation (SHG) crystal 18 which doubles the frequency of the light output may be placed between the active layer 14 and the external mirror 17. Also, the VECSEL 10 includes a collimating lens 16 that collimates the pumping beam emitted from the pump laser 15. For instance, the active layer 14 may have a multiple quantum well structure having a resonant periodic gain (RPG) structure and is excited by the pumping beam to emit light with a predetermined wavelength $\lambda_2$. The pump laser 15 inputs a pumping beam having a shorter wavelength $\lambda_1$ than the wavelength $\lambda_2$ of the light emitted from the active layer 14 to excite the active layer 14.

In the above described configuration, a pumping beam with a relatively short wavelength $\lambda_1$ emitted from the pump laser 15 is incident on the active layer 14, and the active layer 14 is excited to emit light with a predetermined wavelength of $\lambda_2$. The emitted light is reflected repetitively between the DBR layer 13 and the external layer 17 through the active layer 14. Thus, a portion of the light amplified in the active layer 14 is output to the outside via the external mirror 17. When the SHG crystal 18 is interposed between the active layer 14 and the external mirror 17, for example, light in the infrared region emitted from the active layer 14 is converted into visible light and then output.

Figure 2:
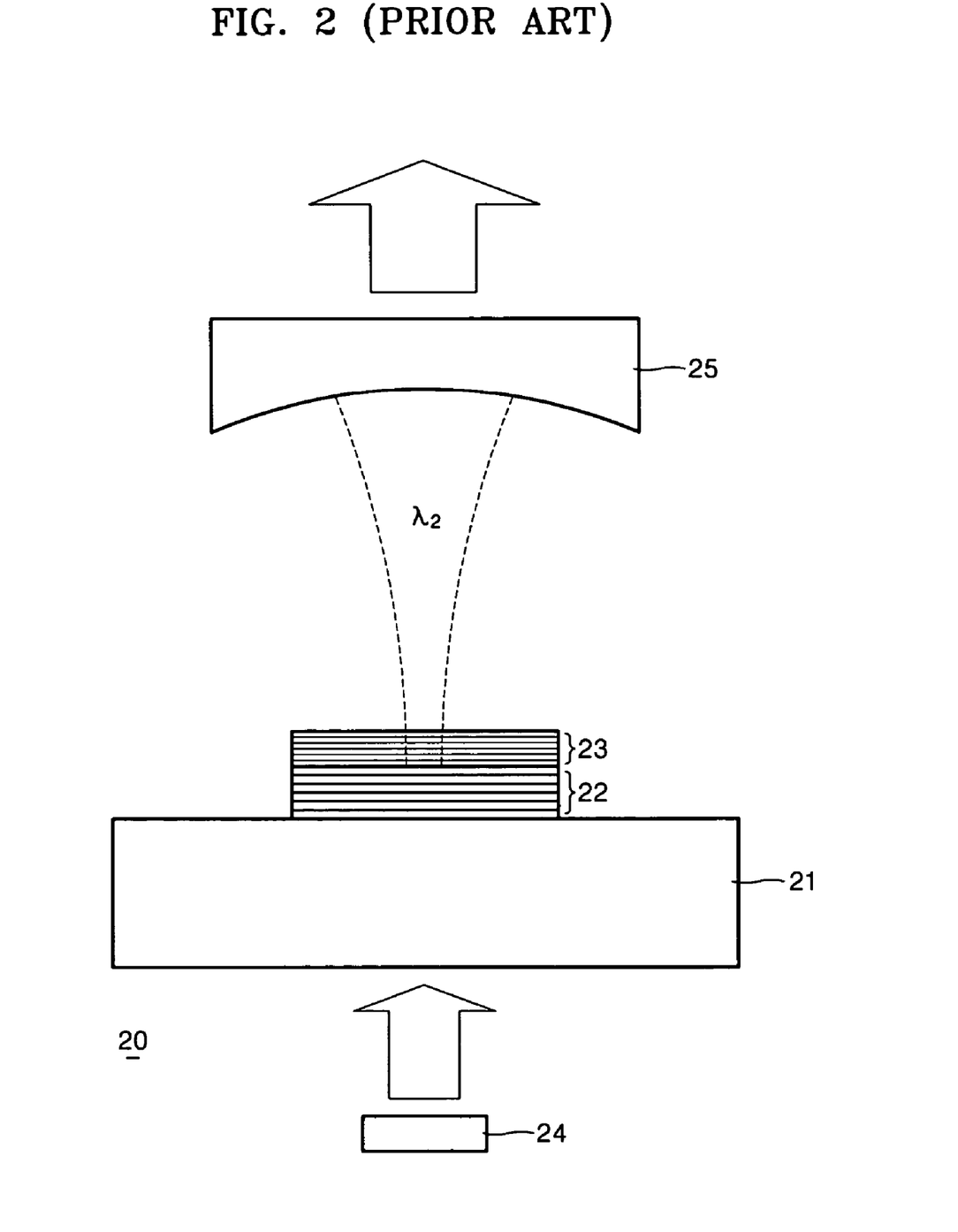
FIG. 2 is a schematic view of a conventional VECSEL using end pumping.

FIG. 2 is a schematic view of a conventional VECSEL 20 using end pumping. In the VECSEL 10 using front pumping illustrated in FIG. 1, the incident surface of the pumping beam in the active layer 14 and the emission surface of the output light are the same. That is, a pumping beam is incident through the top surface of the active layer and the output light is emitted through the top surface of the active layer 14. On the other hand, as illustrated in FIG. 2, in the VECSEL 20 using end pumping, a pumping beam is incident through the lower surface of the active layer 23 and the output light is emitted through the top surface of the active layer 23 to an external mirror 25 facing the active layer 23. For example, a DBR layer 22 and an active layer 23 are stacked sequentially on a light transmissive heat spreader 21 which is formed of diamond or silicon carbide (SiC), and a pump laser 24 faces the active layer 23 with the light transmissive heat spreader 21 interposed therebetween. Accordingly, a pumping beam emitted from the pump laser 24 passes through the light transmissive heat spreader 21 and is incident on the lower surface of the active layer 23. Such end pumping enables easy assembly of the VECSEL and reduces light loss since a pumping beam is perpendicularly incident on the active layer.

However, in the conventional VECSEL, a pumping beam emitted from the pump laser may not be completely absorbed in the active layer, and a portion of the pumping beam is dispersed by the heat sink or passes through the active layer and then emitted. In VECSELs using front pumping, a portion of the pumping beam which is not completely absorbed in the active layer passes through the DBR layer and is wasted. Also, in VECSELs using end pumping, a portion of the pumping beam which is not absorbed by the active layer is emitted through the top surface of the active layer. Accordingly, conventional VECSELs cannot efficiently use the energy of the pumping beam, and thus have low efficiency.

SUMMARY OF THE DISCLOSURE

The present disclosure may provide a vertical external cavity surface emitting laser (VECSEL) using end pumping in which a pumping beam emitted from a pump laser is recycled to increase the pumping beam absorption in an active layer.

According to an aspect of the present invention, there may be provided a VECSEL comprising: an active layer for generating and emitting signal light; an external mirror that is separated from and faces a top surface of the active layer, and is adapted to transmit a first portion of the signal light generated by the active layer and to reflect a second portion of the signal light to the active layer; a first reflection layer positioned beneath a lower surface of the active layer and adapted to reflect the signal light generated by the active layer to the external mirror; a pump laser for emitting a pumping beam toward the lower surface of the active layer through the first reflection layer, the pumping beam being adapted to excite the active layer; and a second reflection layer positioned on the top surface of the active layer and adapted to reflect a portion of the pumping beam transmitted through the active layer back to the active layer.

The second reflection layer may be adapted to transmit the signal light emitted from the active layer.

The second reflection layer may be a Distributed Bragg Reflector comprising two semiconductor layers with different refractive indexes alternately stacked.

The two semiconductor layers with different refractive indexes may be an $Al_xGa_{1-x}As$ layer and an $Al_yGa_{1-y}As$ layer, where $0 \leq x,y \leq 1$, $x \neq y$. The thickness of each of the semiconductor layers may be approximately one fourth of the wavelength of the pumping beam. When H refers to the semiconductor layer with a first refractive index and L refers to the semiconductor layer with second refractive index and the first refractive index is higher than the second refractive index, the second reflection layer may have a multi-layer structure of $((L/2)H(L/2))^N$, where N is a positive integer.

The second reflection layer may be a dielectric stack reflection layer with a multi-layer structure in which two dielectric layers with different refractive indexes are alternately stacked. The thickness of each of the dielectric layers forming the second reflection layer may be approximately one fourth of the wavelength of the pumping beam.

The second reflection layer may be a metal layer. The thickness of the metal layer may be 50 nm or less.

The reflectance with respect to the pumping beam of the second reflection layer may be more than 50%.

An anti-reflection layer positioned on the top surface of the second reflection layer and adapted to enhance the transmission of the signal light through the second reflection layer may be further included.

The first reflection layer may be adapted to transmit the pumping beam emitted from the pump laser and reflect the signal light emitted from the active layer.

The first reflection layer may be a DBR layer with a multi-layer structure comprising two semiconductor layers with different refractive indexes alternately stacked. The thickness of each of the semiconductor layers forming the first semiconductor layer may be approximately one fourth of the wavelength of the signal light.

A light transmissive heat spreader positioned beneath the lower surface of the first reflection layer and adapted to cool down the active layer may be further included. The light transmissive heat spreader may be formed of a material selected from the group consisting of diamond, silicon carbide (SiC), aluminum nitride (AlN), and gallium nitride (GaN).

A second harmonic generation (SHG) crystal that doubles the frequency of the signal light emitted from the active layer and is interposed between the active layer and the external mirror may be further included.

The active layer may comprise a plurality of quantum well layers, and each of the quantum well layers may be disposed in an anti-node of a standing wave generated by the signal light resonating between the external mirror and the first reflection layer.

BRIEF DESCRIPTION OF THE DRAWINGS

The above and other features and advantages of the present invention will be described in detailed exemplary embodiments thereof with reference to the attached drawings in which.

DETAILED DESCRIPTION OF THE PREFERRED EMBODIMENTS

The present invention will now be described more fully with reference to the accompanying drawings, in which exemplary embodiments of the invention are shown.

Figure 3:
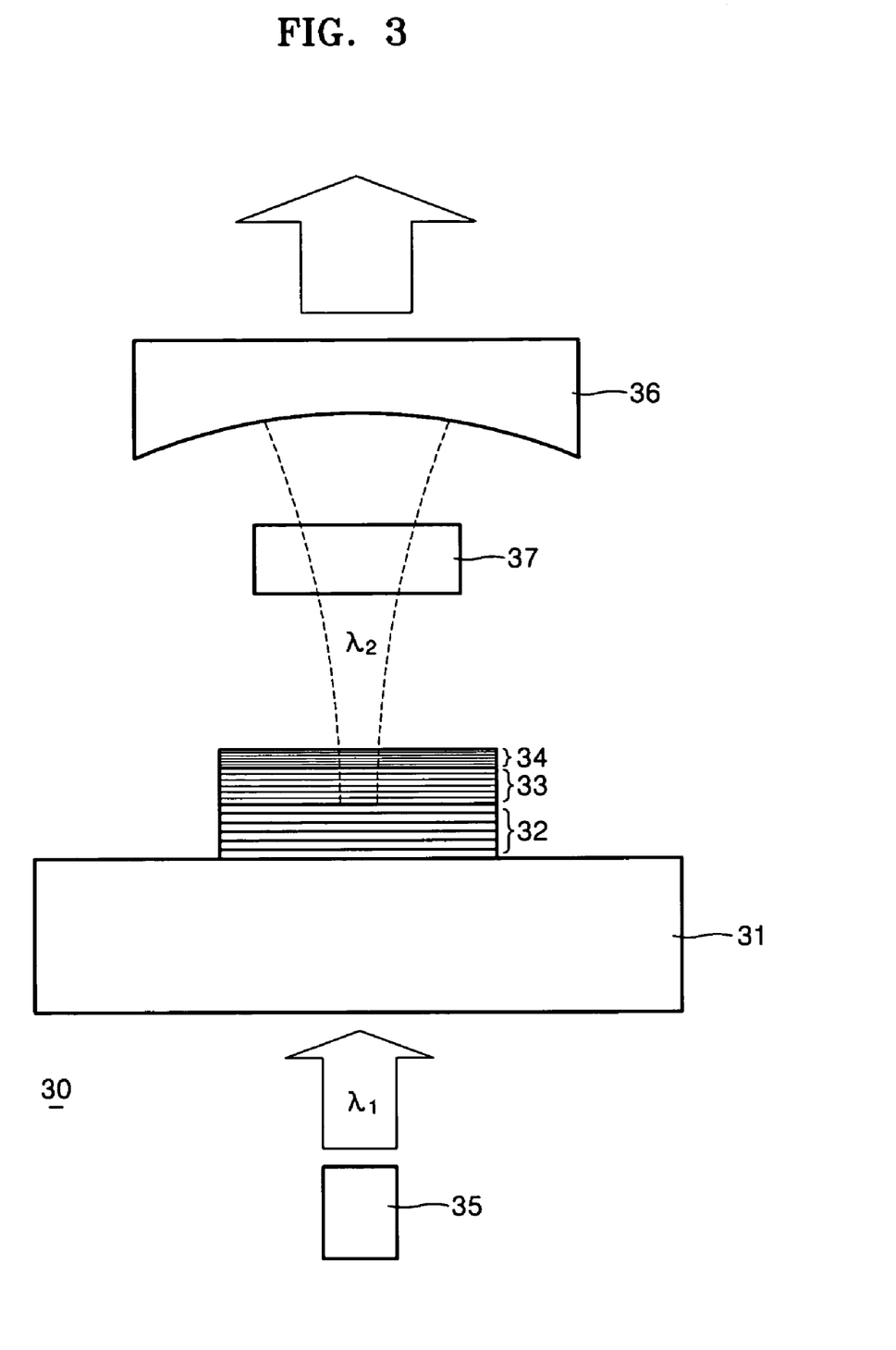
FIG. 3 is a schematic view of a VECSEL with a pumping beam reflection layer according to an embodiment of the present invention.

FIG. 3 is a schematic view of a VECSEL 30 with a pumping beam reflection layer according to an embodiment of the present invention. Referring to FIG. 3, the VECSEL 30 uses end pumping and includes a pumping beam reflection layer to reflect a pumping beam. That is, the VECSEL 30 according to an embodiment of the present invention includes an active layer 33 emitting signal light having a predetermined wavelength $\lambda_2$, an external mirror 36 separated from and facing the top surface of the active layer 33, a signal light reflection mirror (layer) 32 contacting the lower surface of the active layer 33 to reflect the signal light generated by the active layer 33 to the external mirror 36, a pump laser 35 emitting a pumping beam with a wavelength $\lambda_1$ toward the lower surface of the active layer 33 to excite the active layer 33, and a pumping beam reflection layer 34 contacting the top surface of the active layer 33 to reflect a portion of the pumping beam transmitted through the active layer 33.

A heat spreader 31 may be further included on the lower surface of the signal light reflection mirror 32 to emit the heat generated by the active layer 33 to the outside. The heat spreader 31 may be light transmissive so that the pumping beam can pass through the heat spreader 31. The light transmissive heat spreader 31 may be composed of diamond, silicon carbide (SiC), aluminum nitride (AlN), or gallium nitride (GaN).

A second harmonic generation (SHG) crystal 37 may be further included between the active layer 33 and the external mirror 36 to double the frequency of the signal light emitted from the active layer 33. When the SHG crystal 37 is interposed between the active layer 33 and the external mirror 36, the light in the infrared region emitted from the active layer 33 may be converted into visible light and then output.

As is well known in the art, the active layer 33 generating the signal light having a predetermined wavelength $\lambda_2$ may have a Resonant Periodic Gain (RPG) structure including a plurality of quantum wells and barriers interposed between the quantum wells. In order to obtain a gain, each quantum well is disposed in an anti-node of a standing wave which is generated by the signal light resonating between the external mirror 36 and the signal light reflection layer 32. The active layer 33 is excited by absorbing the pumping beam emitted from the pump laser 35 and emits signal light. To excite the active layer 33, the wavelength $\lambda_1$ of the pumping beam may be shorter than the wavelength $\lambda_2$ of the signal light generated by the active layer 33. For example, when the active layer 33 emits signal light in the infrared region between 920 nm and 1060 nm, the wavelength $\lambda_1$ of the pumping beam may be approximately 808 nm.

The external mirror 36 is separated a predetermined distance from the top surface of the active layer 33, reflects most of the incident signal light which is generated by the active layer 33 so that the signal light can resonate, and transmits a portion of the signal light to the outside. As illustrated in FIG.

3, the reflection surface of the external mirror 36 is concave to converge the reflected signal light on the active layer 33.

The signal light reflection layer 32 contacting the lower surface of the active layer 33 reflects the signal light generated by the active layer 33 and helps to resonate the signal light between the external mirror 36 and the signal light reflection layer 32. The signal light reflection layer 32 should be transmissive at the wavelength $\lambda_1$ of the pumping beam so that the pumping beam emitted from the pump laser 35 can pass through the signal light reflection layer 32 to be absorbed into the active layer 33. For this, as is well known in the art, the signal light reflection layer 32 may be a Distributed Bragg Reflector (DBR) layer which is designed to have maximum reflectance at the wavelength $\lambda_2$ of the signal light. That is, the signal light reflection layer 32 may be formed of two alternately stacked semiconductor layers having different refractive indexes and each having a thickness of approximately one fourth of the wavelength of the signal light, that is $\lambda_2/4$. For example, the DBR layer which reflects the signal light and transmits the pumping beam can be obtained by alternately repeating an $Al_xGa_{1-x}As$ layer and an $Al_yGa_{1-y}As$ layer ($0 \leq x, y \leq 1$, $x \neq y$).

Also, a pumping beam reflection layer 34 formed on the top surface of the active layer 33 reflects a portion of the pumping beam which is not absorbed by the active layer 33 back to the active layer 33. The pumping beam reflection layer 34 may be transmissive at the wavelength of the signal light so that the signal light generated by the active layer 33 can resonate between the external mirror 36 and the signal light reflection layer 32. Accordingly, the pumping beam reflection layer 34 reflects the pumping beam emitted from the pump laser 35 and transmits the signal light emitted from the active layer 33. For example, the pumping beam reflection layer 34 may be a DBR which is designed to have maximum reflectance at the wavelength $\lambda_1$ of the pumping beam and to have minimum reflectance at the wavelength $\lambda_2$ of the signal light. That is, the pumping beam reflection layer 34 includes two semiconductor layers and each of the semiconductor layers has a thickness of approximately one fourth of the pumping beam wavelength $\lambda_1$, that is $\lambda_1/4$. The thickness of each layer forming the pumping beam reflection layer 34 can be designed optimally according to simulation. The two semiconductor layers may be respectively an $Al_xGa_{1-x}As$ layer and an $Al_yGa_{1-y}As$ layer ($0 \leq x,y \leq 1$, $x \neq y$), similar to the signal light reflection layer 32. The pumping beam reflection layer 34 satisfying the above conditions may have various structures.

Figure 5:
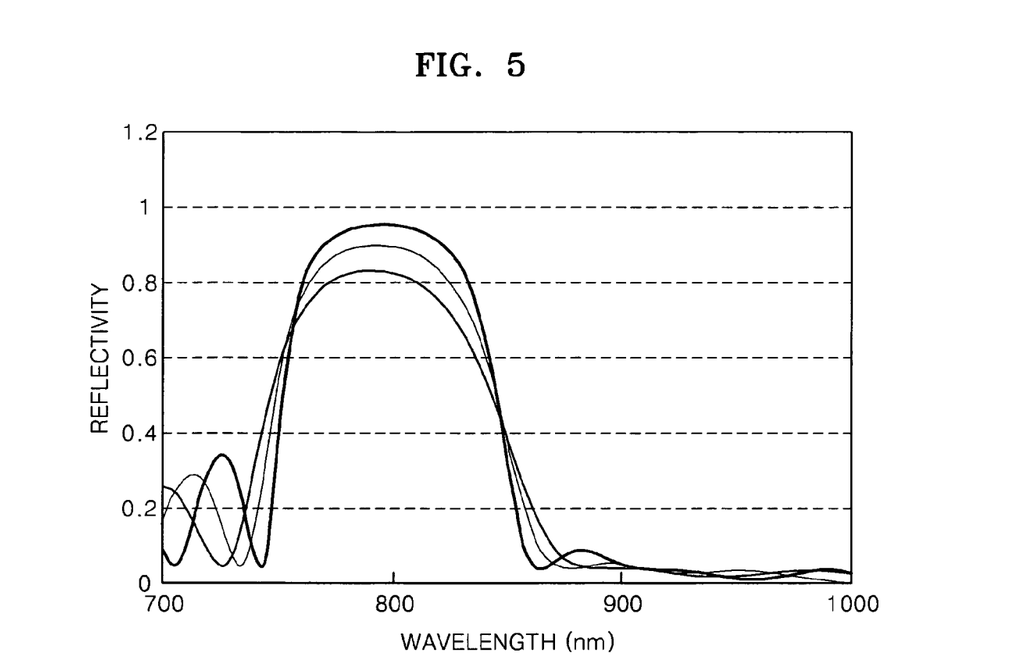
FIGS. 5 and 6 are graphs illustrating reflectivity according to wavelength of a pumping beam in the pumping beam reflection layer shown in FIG. 3.

For example, FIG. 5 is a graph illustrating reflectivity according to wavelength in the pumping beam reflection layer 34 having a multiple layer structure of $((L/2)H(L/2))^N$, where L refers to a semiconductor layer having a relatively low refractive index, and H refers to a semiconductor layer having a relatively high refractive index among the two semiconductor layers, and N is a positive integer. For example, when N is 5, the pumping beam reflection layer 34 is stacked in the sequence of (L/2)H(L/2)(L/2)H(L/2)(L/2)H(L/2)(L/2)H(L/2)(L/2)H(L/2), that is, (L/2)HLHLHLHLH(L/2). As illustrated in FIG. 5, when the wavelength of the pumping beam is 808 nm, the pumping beam reflection layer 34 reflects most of the pumping beam. Also, when the signal light is 920 nm or 1060 nm, the pumping beam reflection layer 34 transmits most of the signal light. In FIG. 5, three graphs are shown for three different values of N. As the value of N, that is, as the number of the stacked semiconductor layers increases, the reflectivity of the pumping beam reflection layer 34 with respect to the pumping beam increases.

Table 1 shows data for another structure of the pumping beam reflection layer 34.

TABLE 1

| Layer | Thickness (nm) |
|---|---|
| $Al_{0.2}Ga_{0.8}As$ | 356.81 |
| AlAs | 61.28 |
| $Al_{0.2}Ga_{0.8}As$ | 47.8 |
| AlAs | 58.36 |
| $Al_{0.2}Ga_{0.8}As$ | 54.87 |
| AlAs | 68.69 |
| $Al_{0.2}Ga_{0.8}As$ | 58.73 |
| AlAs | 71.95 |
| GaAs | 30.93 |
| $Al_{0.2}Ga_{0.8}As$ | 27.22 |
| AlAs | 72.05 |
| $Al_{0.2}Ga_{0.8}As$ | 59.86 |
| AlAs | 72.47 |
| $Al_{0.2}Ga_{0.8}As$ | 60.33 |
| AlAs | 72.9 |
| $Al_{0.2}Ga_{0.8}As$ | 60.57 |
| AlAs | 71.67 |
| $Al_{0.2}Ga_{0.8}As$ | 24.22 |
| GaAs | 5 |

Figure 6:
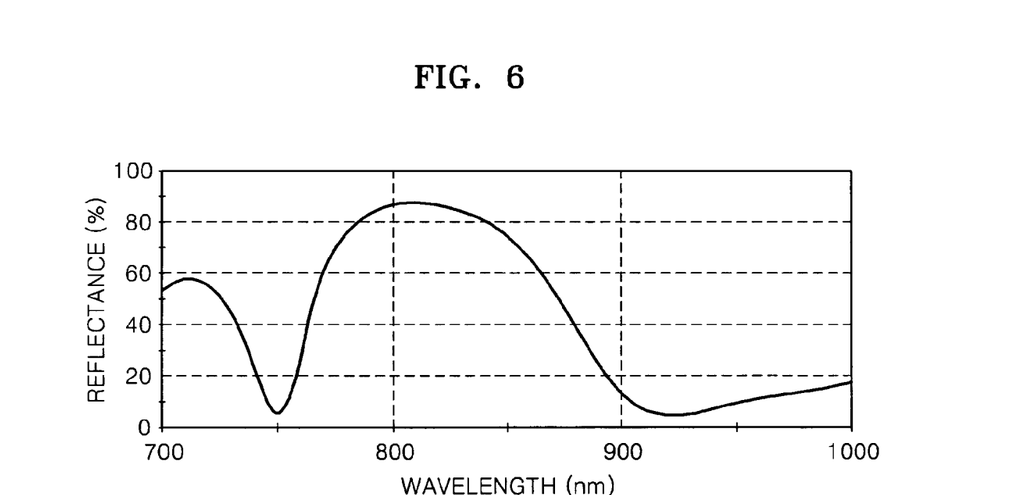

As shown in Table 1, a GaAs layer is formed immediately above the top surface of the active layer 33 with a thickness of 5 nm, $Al_{0.2}Ga_{0.8}As$ layers and AlAs layers with the thicknesses shown in the right column of Table 1 are alternately stacked on the GaAs layer. FIG. 6 is a graph illustrating reflectivity according the wavelength in the pumping beam reflection layer 34 according to Table 1. As illustrated in FIG. 6, the pumping beam reflection layer 34 has maximum reflectance with respect to a pumping beam with a wavelength of 808 nm and the minimum reflectance with respect to the signal light with a wavelength of 920 nm.

The pumping beam reflection layer 34 may have other structures than the DBR layer. For example, the pumping beam reflection layer 34 may be a dielectric stack reflection layer with a multiple layer structure in which two dielectric layers having different refractive indexes are alternately stacked. Like in the semiconductor DBR layer, each of the dielectric layers that form the dielectric stack reflection layer may have a thickness of one fourth of the pumping beam wavelength $\lambda_1$. The dielectric stack reflection layer may be formed of a dielectric material such as $SiO_2$, $Al_2O_3$.

Also, the pumping beam reflection layer 34 may be a very thin metal layer. When a thin metal layer is used, the thickness of the pumping beam layer 34 may be 50 nm or less in order to reduce the reflection of the signal light. With the thickness of 50 nm or less, the reflectance with respect to the pumping beam of the pumping beam reflection layer 34 may be decreased. However, the reflectance with respect to the pumping beam of the pumping beam reflection layer 34 according to certain embodiments of the present invention does not have to be almost 100% and approximately 50% is sufficient.

Although not shown in the drawings, an anti-reflection layer may be further coated on the top surface of the pumping beam reflection layer 34 so that the pumping beam reflection layer 34 can transmit the signal light generated by the active layer 33 more efficiently.

Figure 4:
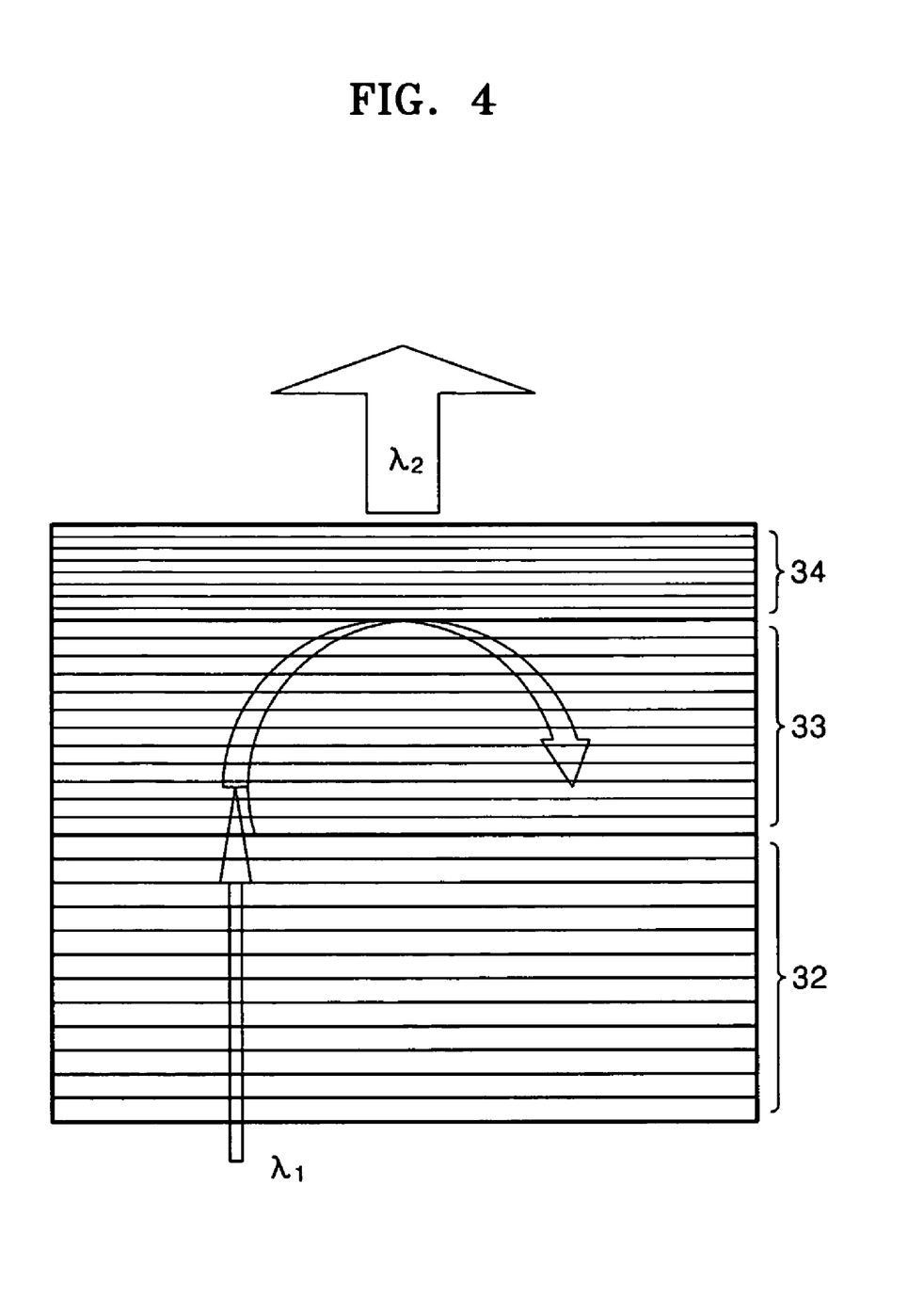
FIG. 4 illustrates the recycling process of a pumping beam by the pumping beam reflection layer shown in FIG. 3.

In the above described configuration, the pumping beam passing through the signal light reflection layer 32 and incident on the lower surface of the active layer 33 enters the active layer 33 and is absorbed to excite the active layer 33 as illustrated in FIG. 4. Then, the portion of the pumping beam which is not absorbed by the active layer 33 is emitted through the top surface of the active layer 33. Conventionally, such a pumping beam passing through the active layer 33 is not recycled and is lost. However, according to certain embodiments of the present invention, a pumping beam reflection layer 34 is formed on the top surface of the active layer 33 to reflect the portion of the pumping beam passing through the active layer 33 back to the active layer 33. Accordingly, the portion of the pumping beam which is not absorbed in the active layer 33 can be recycled to excite the active layer 33.

Figure 7:
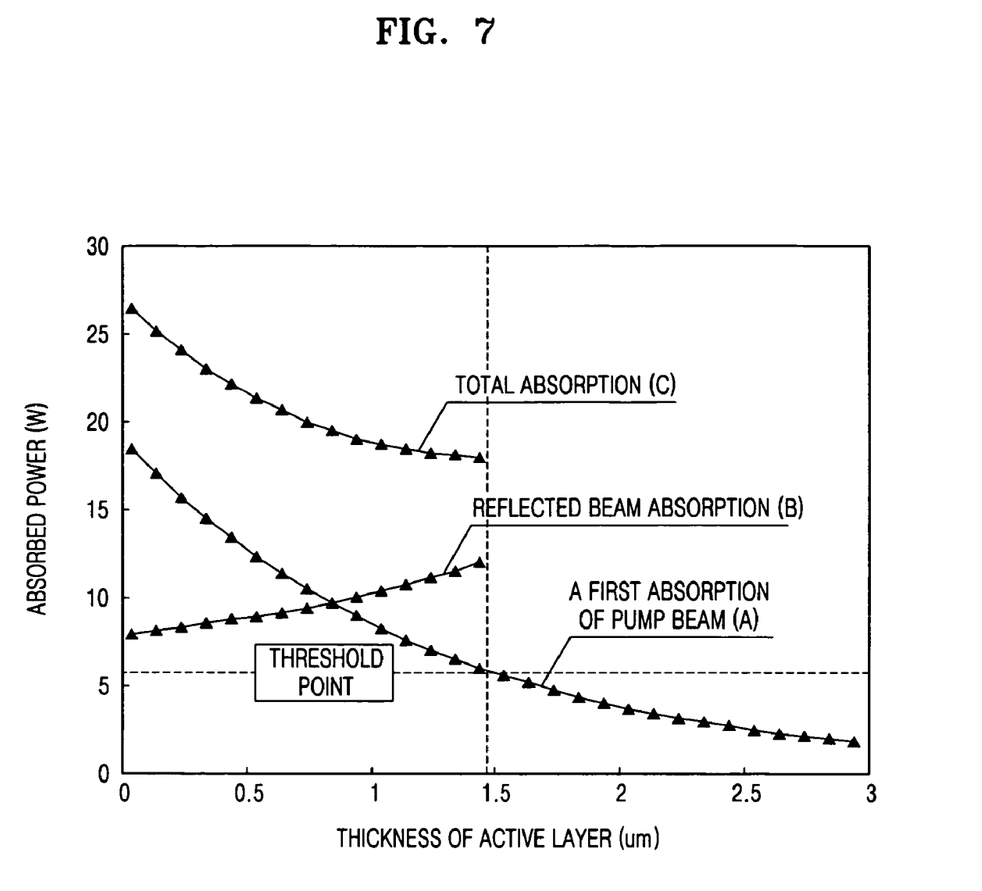
FIG. 7 is a graph illustrating an increase in the absorption of the pumping beam in an active layer due to a pumping beam reflection layer according to an embodiment of the present invention.

FIG. 7 is a graph illustrating an increase in the portion of the pumping beam absorbed in the active layer 33 due to the pumping beam reflection layer 34 according to an embodiment of the present invention. As illustrated in graph A of FIG. 7, the pumping beam which is directly emitted from the pump laser 35 enters through the surface of the active layer 33 and is attenuated as it proceeds through the active layer 33. Accordingly, the amount of the pumping beam absorbed decreases as the pumping beam passes through the active layer 33. Consequently, the power absorbed from the pumping beam at a depth of 1.5 μm from the surface of the active layer 33 is less than a threshold power, and thus the active layer 33 cannot emit signal light from a depth greater than 1.5 μm. Accordingly, in this instance, the optimum thickness of the active layer 33 may be approximately 1.5 μm. The portion of the pumping beam which is not absorbed by the active layer 33 is emitted through the top surface of the active layer 33. When the above described pumping beam reflection layer 34 is formed on the top surface of the active layer 33, the portion of the pumping beam emitted through the top surface of the active layer 33 is reflected by the pumping beam reflection layer 34 and is incident again on the top surface of the active layer 33. As illustrated in graph B of FIG. 7, the reflected pumping beam is absorbed by the active layer 33. As a result, the overall absorption of the pumping beam in the active layer 33 is increased as illustrated in graph C of FIG. 7, and the variation of the pumping beam absorption according to the depth in the active layer 33 is decreased as well. Accordingly, the overall density of carriers in the active layer 33 is increased to increase the output of the laser device, and the output according to the depth is relatively uniform thus improving the characteristics of the laser device.

Figure 8:
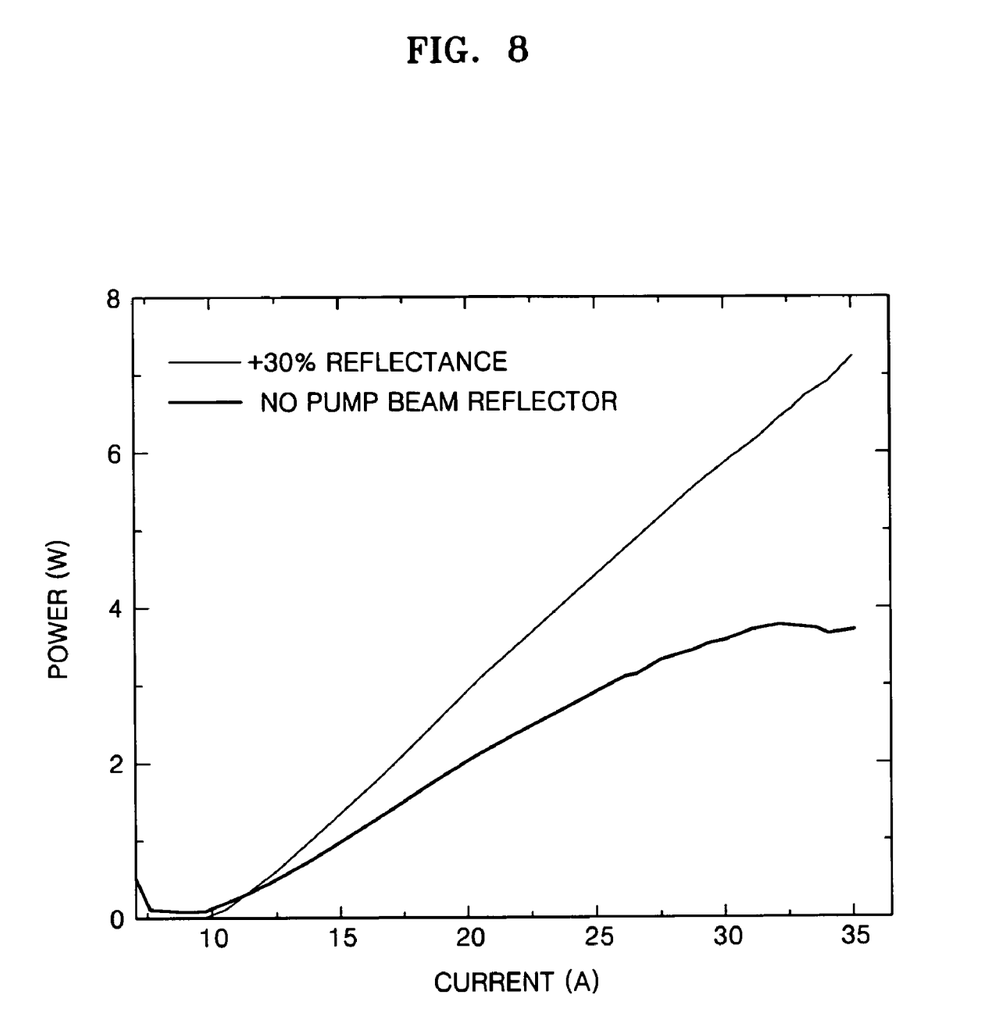
FIG. 8 is a graph illustrating an increase in the output of a VECSEL according to an embodiment of the present invention.

FIG. 8 is a graph illustrating the increase in light output of the VECSEL 30 according to an embodiment of the present invention. The lower graph of FIG. 8 is from a VECSEL without a pumping beam reflection layer formed on the top surface of the active layer, and the upper graph of FIG. 8 is from a VECSEL with a pumping beam reflection layer on the top surface of the active layer. With other conditions being equal, as illustrated in FIG. 8, when a pumping beam reflection layer is used to recycle the pumping beam, the output power is increased by more than 30% for a high input current over conventional structures. Conventionally, when the input current is more than 30 A, the output saturates. However, according to certain embodiments of the present invention, the input and the output of the VECSEL can have a linear relationship.

As described above, the VECSEL according to exemplary embodiments of the present invention includes a pumping beam reflection layer on the top surface of the active layer to recycle the portion of the pumping beam which is not absorbed by the active layer and wasted otherwise. As a result, the efficiency of the pumping beam usage is increased so that a laser device with large output can be provided. Also, the laser device can have a thinner active layer and less power consumption. Furthermore, the output variation with respect to the input variation has a large slope, increasing the linearity of variation, and the laser devices according to exemplary embodiments of the present invention can be used as modulators.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A vertical external cavity surface emitting laser (VECSEL), comprising:
   an active layer for generating and emitting signal light;
   an external mirror that is separated from and faces a top surface of the active layer and is configured to transmit a first portion of the signal light generated by the active layer and to reflect a second portion of the signal light to the active layer;
   a first reflection layer positioned beneath a lower surface of the active layer and configured to reflect the signal light generated by the active layer to the external mirror;
   a pump laser for emitting a pumping beam toward the lower surface of the active layer through the first reflection layer, the active layer being configured to be excited by the pumping beam; and
   a second reflection layer positioned on the top surface of the active layer and configured to reflect a portion of the pumping beam transmitted through the active layer back to the active layer.

2. The VECSEL of claim 1, wherein the second reflection layer is a Distributed Bragg Reflector comprising two alternately stacked semiconductor layers with different refractive indexes.

3. The VECSEL of claim 2, wherein the thickness of each of the semiconductor layers is approximately one fourth of the wavelength of the pumping beam.

4. The VECSEL of claim 3, wherein the two semiconductor layers with different refractive indexes are an $Al_xGa_{1-x}As$ layer and an $Al_yGa_{1-y}As$ layer, where $0 \leq x, y \leq 1$, $x \neq y$.

5. The VECSEL of claim 4, wherein when H refers to a first semiconductor layer with a first refractive index and L refers to a second semiconductor layer with a second refractive index and the first refractive index is higher than the second refractive index, the second refraction layer has a multi-layer structure of $(LHL)^N$, where N is a positive integer.

6. The VECSEL of claim 1, wherein the second reflection layer is a dielectric stack reflection layer with a multi-layer structure in which two dielectric layers with different refractive indexes are alternately stacked.

7. The VECSEL of claim 6, wherein the thickness of each of the dielectric layers forming the second reflection layer is approximately one fourth of the wavelength of the pumping beam.

8. The VECSEL of claim 1, wherein the second reflection layer is a metal layer.

9. The VECSEL of claim 8, wherein the thickness of the metal layer is 50 nm or less.

10. The VECSEL of claim 1, wherein the reflectance of the second reflection layer with respect to the pumping beam is more than 50%.

11. The VECSEL of claim 1, further comprising an antireflection layer positioned on the top surface of the second reflection layer and configured to enhance the transmission of the signal light through the second reflection layer.

12. The VECSEL of claim 1, wherein the first reflection layer is a Distributed Bragg Reflector layer with a multi-layer structure comprising two alternately stacked semiconductor layers with different refractive indexes.

13. The VECSEL of claim 12, wherein the thickness of each of the semiconductor layers forming the first reflection layer is approximately one fourth of the wavelength of the signal light.

14. The VECSEL of claim 1, further comprising a light transmissive heat spreader positioned beneath the lower surface of the first reflection layer and configured to cool down the active layer.

15. The VECSEL of claim 14, wherein the light transmissive heat spreader is formed of a material selected from the group consisting of diamond, silicon carbide (SiC), aluminum nitride (AlN), and gallium nitride (GaN).

16. The VECSEL of claim 1, further comprising a second harmonic generation (SHG) crystal that is configured to double the frequency of the signal light emitted from the active layer and is interposed between the active layer and the external mirror.

17. The VECSEL of claim 1, wherein the active layer comprises a plurality of quantum well layers, and each of the quantum well layers is disposed in an anti-node of a standing wave generated by the signal light resonating between the external mirror and the first reflection layer.

18. The VECSEL of claim 14, wherein:
the pump laser is configured to emit the pumping beam toward a lower surface of the light transmissive heat spreader; and
the light transmissive heat spreader is configured to pass the pumping beam therethrough toward the lower surface of the first reflection layer beneath which the light transmissive heat spreader is positioned.

19. The VECSEL of claim 1, wherein the second reflection layer is configured to have maximum reflectance at a wavelength of the pumping beam and have a minimum reflectance at a wavelength of the signal light.

20. The VECSEL of claim 1, wherein the first reflection layer is configured to have maximum reflectance at a wavelength of the signal light, and be transmissive at a wavelength of the pumping beam.

21. The VECSEL of claim 1, wherein the second reflection layer is configured to transmit the signal light emitted from the active layer to the external mirror in a direction transverse to a top surface of the second reflection layer.

* * * * *